United States Patent
Zhang et al.

(10) Patent No.: US 6,807,071 B1
(45) Date of Patent: Oct. 19, 2004

(54) TRANSFORMER ISOLATED DRIVER

(75) Inventors: Alpha J. Zhang, TaiPei (TW); Bo Wang, TaiPei (TW); Hongjian Gan, TaiPei (TW)

(73) Assignee: Delta Electronics Inc., Taoyuan Shien (TW)

( * ) Notice: Subject to any disclaimer, the term of this patent is extended or adjusted under 35 U.S.C. 154(b) by 0 days.

(21) Appl. No.: 10/629,091

(22) Filed: Jul. 28, 2003

(51) Int. Cl.$^7$ ............................................. H02M 3/335
(52) U.S. Cl. ........................................ 363/20; 363/131
(58) Field of Search ............................ 363/16, 17, 18, 363/20, 22, 24, 131, 132

(56) References Cited

U.S. PATENT DOCUMENTS

| | | | |
|---|---|---|---|
| 5,822,199 A | * | 10/1998 | Jacobs et al. .................. 363/20 |
| 6,038,145 A | * | 3/2000 | Jacobs et al. .................. 363/20 |
| 6,069,802 A | * | 5/2000 | Priegnitz ................. 363/21.06 |
| 6,208,535 B1 | * | 3/2001 | Parks .......................... 363/26 |
| 6,477,065 B2 | * | 11/2002 | Parks ....................... 363/21.06 |
| 2002/0141206 A1 | * | 10/2002 | Brkovic ....................... 363/24 |

* cited by examiner

*Primary Examiner*—Adolf Berhane
(74) *Attorney, Agent, or Firm*—Haverstock & Owens LLP

(57) ABSTRACT

A transformer isolated gate driver for realizing the driving of a power switch (a MOSFET) includes a PWM driver, an input capacitor, a transformer, an output diode, a active switch (a small power MOSFET) having a gate and a source connected to the first and second terminals of the secondary winding of the transformer respectively, an output capacitor connected to one of the first terminal of the transformer and a drain of the active switch in series, and a series connected circuit having the first and second terminals of the transformer, the output capacitor, the output diode, and the active switch. The charges across an equivalent input capacitor of the power switch are discharged through the series connected circuit. When the PWM signal is pulled to zero from normal operation, the driving signal on the power switch is kept zero also.

20 Claims, 5 Drawing Sheets

TRANSFORMER ISOLATED DRIVER

FIELD OF THE INVENTION

The present invention relates to a transformer isolated driver, and more particularly to a transformer isolated gate driver with an active switch (For example: a small power MOSFET) so as to achieve reliable transient performance.

BACKGROUND OF THE INVENTION

The transformer isolated drivers are used for the driving of the high side power switch (For example: a MOSFET). Please refer to FIG. 1, which is the circuit of a transformer isolated driver of the prior art. T1 is an isolation transformer, QM is a switch (a MOSFET), the capacitor C1 is an input capacitor of the transformer T1, and the reference directions of the voltages on the capacitors are shown in FIG. 1, and C3 is an equivalent input capacitor of the switch QM.

FIG. 2 is the operating waveforms of the circuit shown in FIG. 1. S1 is the waveform of the output signal of the pulse width modulation (PWM) driver, S2 is the waveform of the primary winding of the transformer, and S3 is the output waveform of the transformer. Assuming that in the steady state, the period of the output signal of the PWM driver S1 is T, the duty-cycle is D, the amplitude value is $V_1$, and the turns ratio of the transformer T1 is 1, then the steady state voltage on the input DC isolation capacitor C1 is $DV_1$. When S1 is high, S3 is also high, and the amplitude of S3 is $(V_1-V_{C1})$, that is $(1-D)V_1$. When S1 is low, S2 is negative, and the amplitude of S2 is $(-V_{C1})$, that is $-DV_1$. Thus, the switch QM has a reversed gate driving voltage so as to have a strong characteristic of anti-interference. However, a shortcoming of the circuit is that when the duty cycle D is larger, the amplitude of S3, which is $(1-D)V_1$, becomes smaller, which might cause the insufficient driving of the switch QM. Therefore, the circuit of this kind of drivers is not suitable for the situations having larger variations of duty cycle.

Please refer to FIG. 3, which is another transformer isolated driver of the prior art. The polarities of the transformer T1 are shown in FIG. 3, capacitor C1 is an input capacitor at the primary side of the transformer, capacitor C2 is an output capacitor at the secondary side of the transformer, and C3 is the equivalent input capacitor of a power switch QM (a MOSFET). Please refer to FIG. 4 for operating waveforms of the circuit shown in FIG. 3, S1 is the waveform of the output signals of the PWM driver, S2 is the waveform on the primary of the transformer, and S3 is the output waveform of the transformer. Assuming that in the steady state, the period of the output signal of the PWM driver S1 is T, the duty-cycle is D, the amplitude value of S1 is V1, and the turn ratio of the transformer is 1, then the voltage of steady state across the input capacitor C1 at steady state is $V_{C1}=DV_1$, the voltage across the output capacitor C2 is $V_{C2}=DV_1$, and the reference directions of the voltages across these two capacitors are shown in FIG. 3. When S1 is high, S2 and S3 are both high. The amplitude of S2 is $V2=(V_1-V_{C1})$, that is. $(1-D)V_1$. The amplitude of S3 is $V_3=(V_2+V_{C2})$, that is $V_1$. Thus the amplitude of S3 has no relationship with the duty-cycle D, and keeps unchanged as $V_1$ at any duty-cycle operating condition. When S1 becomes zero, the input/output voltages of the transformer becomes $-DV_1$, thus the diode DR is conducted, and the voltage across the equivalent input capacitor C3 of the switch QM is kept zero.

However, the still existed drawback of the above-mentioned transformer isolated drivers is: that when the driving signal S1 is disappeared due to certain reasons, S3 will become zero immediately as mentioned above. But latter on, the input of the transformer T1 is crossed by the bias of voltage $(-DV_1)$ from the capacitor C1, and will be saturated gradually, thus the amplitude of the input/output voltages of the transformer T1 will become smaller starting from $DV_1$. Since the voltage across the capacitor C2, is still $DV_1$, therefore, the voltage across the equivalent input capacitor C3 of the switch QM will be increased starting from zero. Until the transformer T1 is saturated, then the primary and secondary side voltages of the transformer T1 will become zero, and the voltage across C3 will finally become $DV_1$, which will cause the switch QM to suffer a mis-triggering in a longer time resulting in circuit damage. Please refer to FIG. 5 for the recorded operating waveform of S3 under circuit protection operating. Therefore, this kind of driving circuits does not have a better transient operating. When a power converter implemented with this driver is started up or is shut down, the power switch will suffer a mis-triggering, thus causing the break down of the whole power converter.

SUMMARY OF THE INVENTION

It is therefore an object of the present invention to provide a transformer isolated gate driver with an active switch (a small power MOSFET) for driving of a power switch with reliable transient performance, and avoiding the power switch from suffering mis-triggering so as to prevent the break down of the whole power converter.

According to the aspect of the present invention, the transformer isolated gate driver electrically connected to a power switch for realizing the driving of the power switch includes: a PWM driver for producing a PWM signal; a transformer electrically connected to the PWM driver; an input capacitor electrically connected to a primary side of the transformer in series; an output capacitor electrically connected to a secondary side of the transformer in series; an output diode electrically connected to two output terminals of the transformer isolated gate driver in parallel; an active switch electrically connected to the output capacitor in series and having an input electrode electrically connected to a first terminal of the secondary side of the transformer, and a first electrode electrically connected to .a second terminal of the secondary side of the transformer; and the secondary side of the transformer, the output capacitor, the output diode, and the active switch are electrically connected in series, and when the PWM signal is disappeared, by discharging a plurality of charges across an equivalent input capacitor of the power switch through the secondary side of the transformer, the output capacitor, and a body diode of the active switch, a driving signal on the power switch is disappeared.

Preferably, the two polarities of the transformer are the same.

Preferably, the two polarities of the primary and secondary windings of the transformer are reversed.

Preferably, the power switch is a MOSFET.

Preferably, the active switch is a small power MOSFET, and the input electrode, the first electrode, and the second electrode of the active switch are a gate, a source, and a drain of a MOSFET respectively.

Preferably, the output capacitor is electrically connected between a cathode of the output diode and the input electrode of the active switch.

Preferably, the output capacitor is electrically connected between an anode of the output diode and the second electrode of the active switch.

Preferably, one selected from a group consisting of the input capacitor, the output capacitor, and the two output terminals of the transformer isolated gate driver is electrically connected to a resistor in parallel selectively.

Preferably, an input diode is electrically connected to the input capacitor in parallel, wherein an anode of the input diode is connected to a first end of the input capacitor connecting with the primary winding of the transformer, and a cathode of the input diode is connected to a second end of the input capacitor.

According to another aspect of the present invention, a transformer isolated circuit electrically connected to a PWM driver and a power switch for realizing the driving of the power switch includes: a transformer; an input capacitor electrically connected to a primary winding of the transformer in series; an output capacitor electrically connected to a secondary side of the transformer in series; an output diode electrically connected to two output terminals of the transformer isolated gate driver in parallel; an active switch electrically connected to the output capacitor in series and having an input electrode electrically connected to a first terminal of the secondary side of the transformer, and a first electrode electrically connected to a second terminal of the secondary side of the transformer; and the secondary side of the transformer, the output capacitor, the output diode, and the active switch are electrically connected in series.

Preferably, the two polarities of the primary and secondary windings of the transformer are the same.

Preferably, the two polarities of the primary and secondary windings of the transformer are reversed.

The present invention may best be understood through the following descriptions with reference to the accompanying drawings, in which:

DETAILED DESCRIPTION OF THE PREFERRED EMBODIMENT

Figure 6:
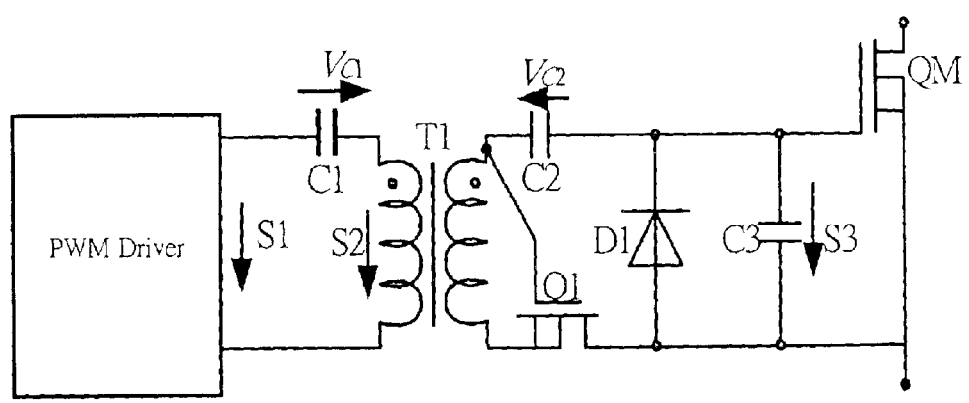
FIG. 6 is the circuit diagram of the first preferred embodiment of the transformer isolated driver of the present invention.

Please refer to FIG. 6, which is the first preferred embodiment of the transformer isolated gate driver of the present invention. The transformer isolated driver for realizing the driving of a power switch QM (a MOSFET) includes a PWM driver for producing PWM signal, a transformer T1 having polarities of primary winding and secondary winding as shown in the figure, an input capacitor C1 and an output capacitor C2 connected to the primary/secondary windings of the transformer T1 in series respectively for blocking DC components, an active switch Q1 (a small power MOSFET), and an output diode D1 connected to the two output terminals of the transformer isolated driver in parallel. Meanwhile, the active switch Q1 is connected to the output capacitor C2 in series, the input electrode (gate) of the active switch Q1 is connected to the first terminal of the secondary winding of the transformer T1, the first electrode (source) of the active switch Q1 is connected to the second terminal of the secondary winding of the transformer T1. A series connected circuit is constructed by the output capacitor C2, the output diode D1, and the active switch Q1. And the input electrode (gate) of the power switch QM (a MOSFET) is connected to the cathode of the output diode D1. The first electrode (source) of the power switch QM is connected to the anode of the output diode D1.

Figure 1:
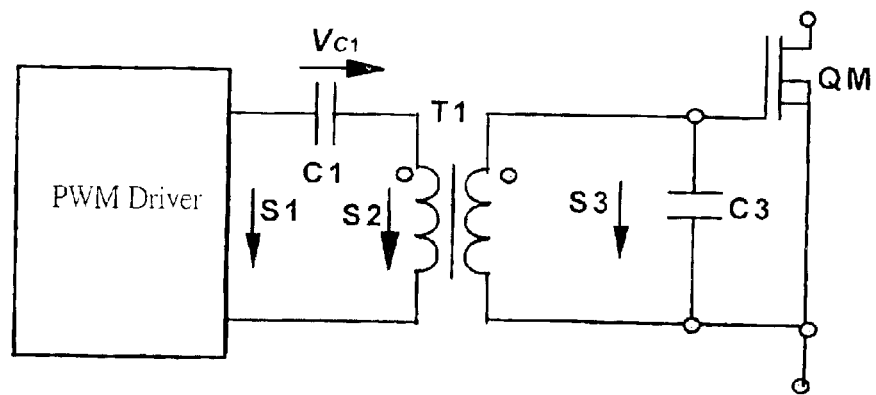
FIG. 1 is the circuit diagram of the transformer isolated driver of the prior art.
Figure 2:
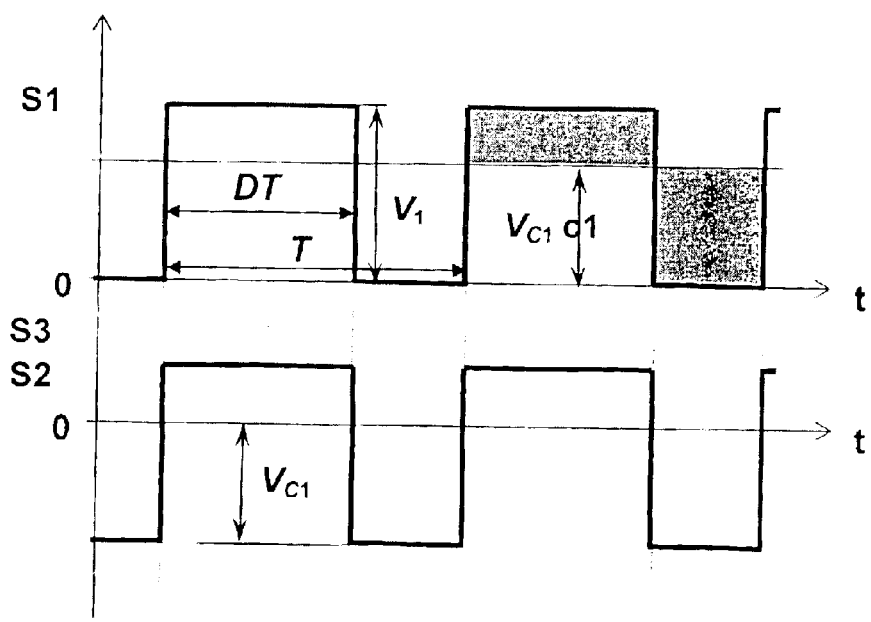
FIG. 2 is the operation waveforms of the transformer isolated driver shown in FIG. 1.

When this driving circuit of FIG. 6 is operating in steady state, the operation waveforms are the same as the waveforms shown in FIG. 2. If the amplitude of the driving signal switch comes from the PWM driver, is $V_1$, and the duty-cycle of the driving signal is D, then the voltage across the input capacitor C1, is $V_{C1}=DV_1$. Assuming that the turn-ratio of the transformer T1 is 1, then the voltage across the output capacitor C2 is $V_{C2}=DV_1$. When the driving signal S1 is high, the output voltage of the secondary winding of the transformer T1 is also high and the amplitude is $(1-D)V_1$. During above period, the active switch Q1 is kept in conducting, and the amplitude of the output voltage S3 to the power switch QM is $(V_{C2}+(1-D)V_1)$, that is $V_1$. When the driving signal S1 becomes zero, the voltage across the primary winding of the transformer S2 is $(-DV_1)$, the gate voltage of the active switch Q1 is also $(-DV_1)$, and the active switch Q1 is switched off. At the mean time, the parasitical body diode of the active switch Q1 is forwardly conducted, and the output diode D1 is conducted also, thus the charges on C3 can be discharged through this short-circuit quickly, and the amplitude of the output waveform of the transformer isolated driver S3 will become zero immediately.

Figure 3:
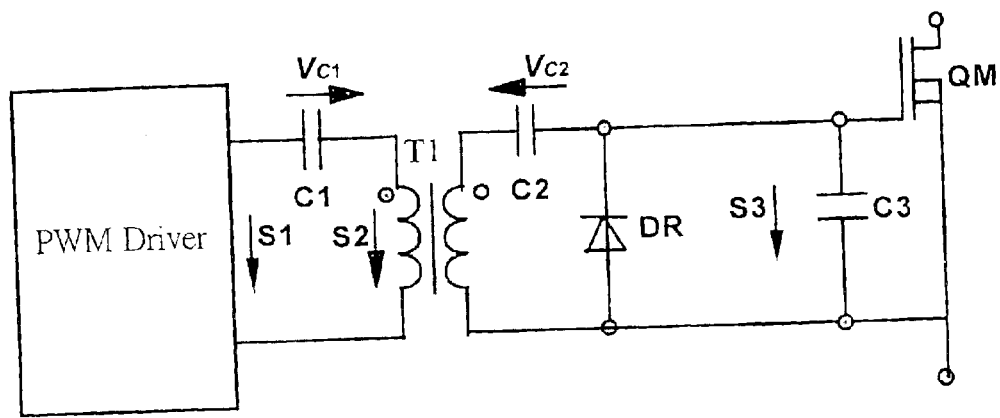
FIG. 3 is the circuit diagram of another transformer isolated driver of the prior art.
Figure 4:
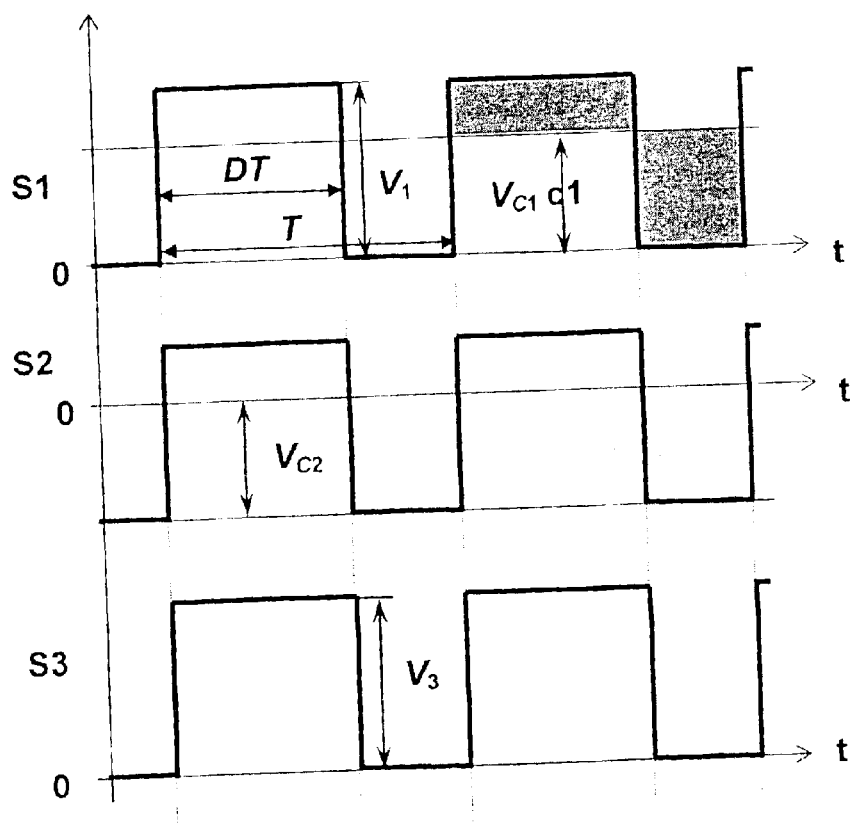
FIG. 4 is the operation waveforms of the transformer isolated driver shown in FIG. 3.
Figure 5:
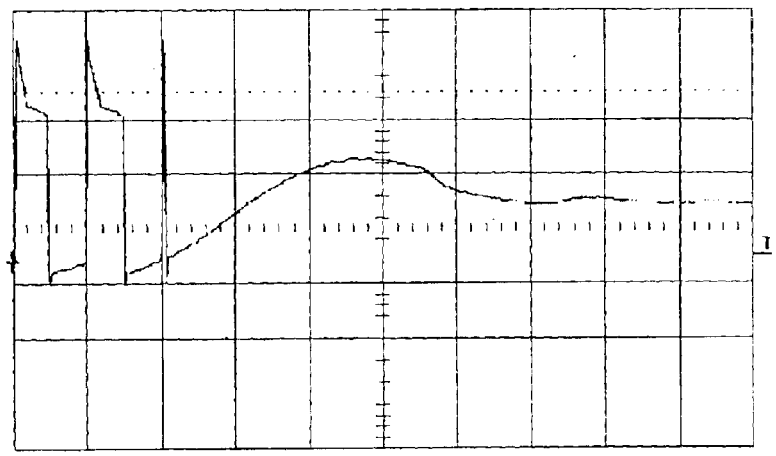
FIG. 5 is the experimental waveform of the output driving signal when the PWM signal is disappeared regarding the circuit shown in FIG. 3.

When the power converter is shutdown from off operation or from circuit failure protection, the driving signal S1 will be pulled to zero. During the period of shutdown, the voltage across the primary winding of the transformer T1 will become $-V_{C1}$, the active switch Q1 is switched off, and the voltage across the output capacitor C2 will be kept as $V_{c2}=DV_1$ at the moment. Thus, the sum of voltage across the secondary winding of transformer T1 and that across the output capacitor C2 will become zero, the charges on the equivalent input capacitor C3 of the power switch will be discharged through the output capacitor C2, the output terminal of the transformer and the body diode of the active switch Q1, and the voltage across C3 will become zero quickly. After that, voltage from the input capacitor C1 crossed by the primary winding of the transformer T1 is continuously, the transformer T1 will go into saturation, and the voltages across the primary and the secondary winding of the transformer will decrease to zero gradually as same as that of the circuit shown in FIG. 3. During this stage, the input electrode (gate) and the first electrode (source) of the active switch Q1 accept a zero voltages, thus the active switch Q1 is sustained at a switched off status, and the voltage across input capacitor C3 of the power switch QM will be kept zero, thus there will be no more mis-triggering problem like that in the circuit shown in FIG. 3.

Figure 7:
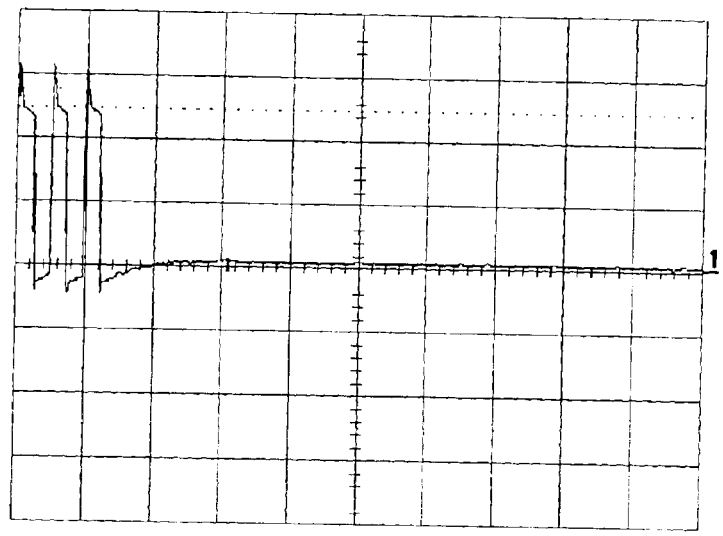
FIG. 7 is the experimental waveform of the output driving signal when the PWM signal is disappeared regarding the circuit shown in FIG. 6.

Therefore, the adding of the active switch Q1 maintains normal operation of the transformer isolated driver under steady states, and meanwhile effectively prevent the mis-triggering to the power switch as that of the prior art, and achieves reliable transient operation when PWM signal is pulled to zero due to off operation or failure protection of the power converter. Please refer to FIG. 7, which is the experimental result of the output waveforms of the transformer isolated gate driver of the present invention when the PWM signal is pulled to zero from normal operation.

Figure 8:
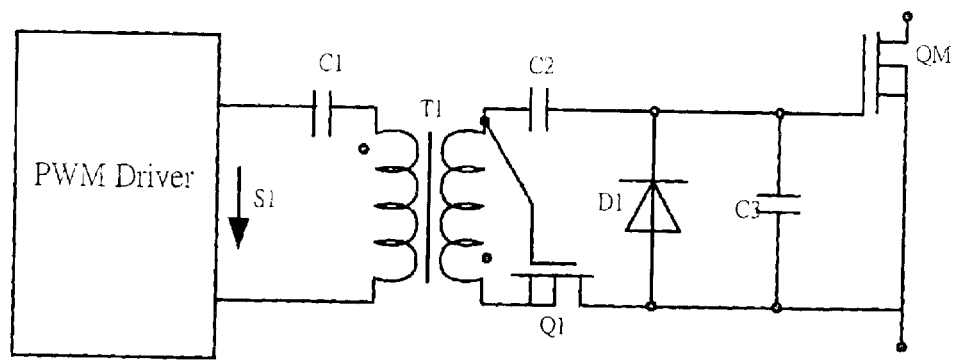
FIG. 8 is the circuit diagram of the second preferred embodiment of the transformer isolated driver of the present invention.
Figure 9:
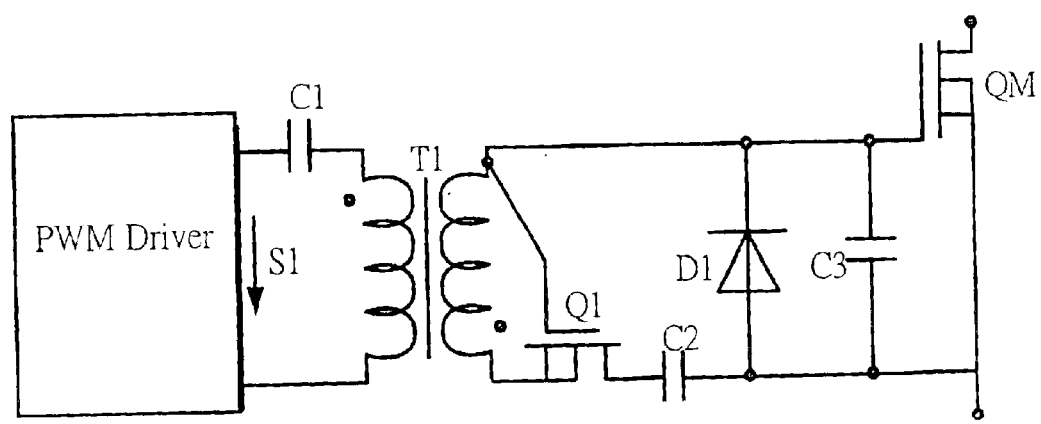
FIG. 9 is the circuit diagram of the third preferred embodiment of the transformer isolated driver of the present invention.

It is understandable, though the above-mentioned is a preferred embodiment of the present invention, there could be other preferred embodiments. For examples, the transformer isolated drivers could also be implemented as that shown in FIG. 8 or in FIG. 9. Please refer to FIG. 8, the difference between this preferred embodiment and the first preferred embodiment of FIG. 6 is that nominal terminals of the transformer shown in FIG. 8 are in reverse but the polarities of the transformer shown in FIG. 6 are the same. Thus the output driving signal of the transformer isolated driver in FIG. 8 and the output driving signal of the transformer isolated driver in FIG. 6 are in reverse phase. Please refer to FIG. 9 for another preferred embodiment, the nominal terminals of the transformer can be either that of FIG. 6 or that of FIG. 8, and the main difference is that the output capacitor C2 is connected in series between the anode of diode D1 and the second electrode (drain) of the active switch Q1. Among the preferred embodiments of FIG. 8 and FIG. 9, a series connected circuit is formed by the secondary winding of the transformer, the output capacitor, the output diode and the active switch in both cases. Besides, additional resistors can be further connected to the input capacitor C1, the output capacitor C2, and the output terminals in parallel. Among the preferred embodiments of FIG. 6, FIG. 8, and FIG. 9, a diode can be connected to the input capacitor C1 in parallel, the anode of the diode is connected to the connecting terminal of the input capacitor C1 and the transformer T1, and the cathode of the diode is connected to the other terminal of the input capacitor C1 thus suppressing the ring voltage across the windings of T1 and avoiding the miss triggering of Q1.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims that are to be accorded with the broadest interpretation so as to encompass all such modifications and similar structure.

What is claimed is:

1. A transformer isolated gate driver electrically connected to a power switch for realizing the driving of said power switch, comprising:
   a PWM driver for producing a PWM signal;
   a transformer electrically connected to said PWM driver;
   an input capacitor electrically connected to a primary side of said transformer in series;
   an output capacitor electrically connected to a secondary side of said transformer in series;
   an output diode electrically connected to two output terminals of said transformer isolated gate driver in parallel; and
   a active switch electrically connected to said output capacitor in series and having an input electrode electrically connected to a first terminal of said secondary side of said transformer, a first electrode electrically connected to a second terminal of said secondary side of said transformer, and a second electrode electrically connected to one of said two output terminals; wherein said secondary side of said transformer, said output capacitor, said output diode, and said active switch are electrically connected in series, and when said PWM signal is disappeared, by discharging a plurality of charges across an equivalent input capacitor of said power switch through said secondary side of said transformer, said output capacitor, and a body diode of said active switch, a mis-triggering signal on said power switch will no more appear.

2. The transformer isolated gate driver according to claim 1, wherein two polarities of said transformer are the same.

3. The transformer isolated gate driver according to claim 1, wherein two polarities of said transformer are reversed.

4. The transformer isolated gate driver according to claim 1, wherein said power switch is a MOSFET.

5. The transformer isolated gate driver according to claim 1, wherein said active switch is a small power MOSFET and said input electrode, said first electrode, and said second electrode of said active switch are a gate, a source, and a drain of said small power MOSFET respectively.

6. The transformer isolated gate driver according to claim 1, wherein said output capacitor is electrically connected between a cathode of said output diode and said input electrode of said active switch in series.

7. The transformer isolated gate driver according to claim 1, wherein said output capacitor is electrically connected between an anode of said output diode and said second electrode of said active switch in series.

8. The transformer isolated gate driver according to claim 1, wherein one selected from a group consisting of said input capacitor, said output capacitor, and said two output terminals of said transformer isolated gate driver is electrically connected to a resistor in parallel selectively.

9. The transformer isolated gate driver according to claim 1, further comprises an input diode electrically connected to said input capacitor in parallel, wherein an anode of said input diode is connected to a first end of said input capacitor connecting with said transformer, and a cathode of said input diode is connected to a second end of said input capacitor.

10. A transformer isolated circuit in which said transformer isolated circuit is electrically connected to a PWM driver and a power switch for realizing the driving of said power switch by an isolation of PWM technique, comprising:
   a transformer;
   an input capacitor electrically connected to a primary winding of said transformer in series;
   an output capacitor electrically connected to a secondary side of said transformer in series;
   an output diode electrically connected to two output terminals of said transformer isolated gate driver in parallel; and
   a active switch electrically connected to said output capacitor in series and having an input electrode electrically connected to a first terminal of said secondary side of said transformer, a first electrode electrically connected to a second terminal of said secondary side of said transformer, and a second electrode electrically connected to one of said two output terminals; wherein said secondary side of said transformer, said output capacitor, said output diode, and said active switch are electrically connected in series.

11. The transformer isolated circuit according to claim 10, wherein two polarities of said first and second windings are the same.

12. The transformer isolated circuit according to claim 10, wherein two polarities of said first and second windings are reversed.

13. The transformer isolated gate driver according to claim 2, wherein said output capacitor is electrically connected between a cathode of said output diode and said input electrode of said active switch in series.

14. The transformer isolated gate driver according to claim 2, wherein said output capacitor is electrically connected between an anode of said output diode and said second electrode of said active switch in series.

15. The transformer isolated gate driver according to claim 2, wherein one selected from a group consisting of said input capacitor, said output capacitor, and said two output terminals of said transformer isolated gate driver is electrically connected to a resistor in parallel selectively.

16. The transformer isolated gate driver according to claim 2, further comprises an input diode electrically connected to said input capacitor in parallel, wherein an anode of said input diode is connected to a first end of said input capacitor connecting with said transformer, and a cathode of said input diode is connected to a second end of said input capacitor.

17. The transformer isolated gate driver according to claim 3, wherein said output capacitor is electrically connected between a cathode of said output diode and said input electrode of said active switch in series.

18. The transformer isolated gate driver according to claim 3, wherein said output capacitor is electrically connected between an anode of said output diode and said second electrode of said active switch in series.

19. The transformer isolated gate driver according to claim 3, wherein one selected from a group consisting of said input capacitor, said output capacitor, and said two output terminals of said transformer isolated gate driver is electrically connected to a resistor in parallel selectively.

20. The transformer isolated gate driver according to claim 3, further comprises an input diode electrically connected to said input capacitor in parallel, wherein an anode of said input diode is connected to a first end of said input capacitor connecting with said transformer, and a cathode of said input diode is connected to a second end of said input capacitor.

* * * * *